United States Patent [19]
Chen et al.

[11] Patent Number: 5,594,683
[45] Date of Patent: Jan. 14, 1997

[54] SRAM CELL USING A CMOS COMPATIBLE HIGH GAIN GATED LATERAL BJT

[76] Inventors: Ming-Jer Chen; Tzuen-Hsi Huang, both of Department of Electronics Engineering & Institute of Electronics, National Chiao-Tung University, Hsin-Chu, Taiwan, 300

[21] Appl. No.: 418,485

[22] Filed: Apr. 7, 1995

[51] Int. Cl.$^6$ ............................................. G11C 11/34
[52] U.S. Cl. .......................... 365/177; 365/174; 365/182; 257/273; 257/903
[58] Field of Search .............................. 257/132, 133, 257/138, 139, 146, 147, 346, 356, 273, 903, 577, 578; 365/150, 174, 177, 186, 187, 188, 182

[56] References Cited

U.S. PATENT DOCUMENTS

| | | | |
|---|---|---|---|
| 5,060,194 | 10/1991 | Sakui et al. | 365/177 |
| 5,422,841 | 7/1995 | Nakayama | 365/225.6 |

OTHER PUBLICATIONS

K. Sakui et al., "A new static memory cell based on reverse base current (RBC) effect of bipolar transistor," IEEE IEDM Tech. Dig., pp. 44–47 Dec. 1988.

T. H. Huang et al., "Base current reversal phenomenon in a CMOS compatible high gain n–p–n gated lateral bipolar transistor," IEEE Trans. Electron Devices, vol. 42, No. 2, pp. 321–327 Feb. 1995.

Primary Examiner—David C. Nelms
Assistant Examiner—F. Niranjan
Attorney, Agent, or Firm—Bo-In Lin

[57] ABSTRACT

This invention presents a new SRAM cell comprising only two MOSFETs: one is the access device for data transfer; and the other is operated as a high gain gated lateral BJT in the reverse base current mode so as to constitute the role of the storage flip-flop or latch. This invention also requires only one-sided peripheral circuitry for Read/Write function. Thus the chip area is greatly saved. In addition, the invention is fully compatible with the existing low-cost, high-yield standard CMOS process.

15 Claims, 10 Drawing Sheets

PRIOR ART

Fig. 1

PRIOR ART

SRAM CELL USING A CMOS COMPATIBLE HIGH GAIN GATED LATERAL BJT

BACKGROUND OF THE INVENTION

1. Field of the Invention

This invention relates generally to memory design. Particularly, this invention relates to a new cell for implementation in the Static Random-Access Memory (SRAM) thus taking advantage of the base current reversal phenomenon in a Complementary Metal Oxide Semiconductor (CMOS) for the construction of compatible high gain gated lateral Bipolar Junction Transistor (BJT).

2. Description of the Prior Art

The conventional CMOS SRAM cell essentially consists of a pair of cross-coupled inverters as the storage flip-flop or latch, and a pair of pass transistors as the access devices for data transfer into and out of the cell. (A large number of different cell configurations are cited in the literature, e.g.,B. Prince, *Semiconductor Memories—A Handbook of Design, Manufacture, and Application,* 2nd ed., New York: John Wiley & Sons, Inc., 1991). Thus, a total of six Metal Oxide Semiconductor Field Effect Transistors (MOSFETs) or four MOSFETs plus two very high resistance load devices are required for implementing a conventional CMOS SRAM cell. However, to achieve high packing density, it is the usual practice to reduce the number of the devices needed for realizing a CMOS SRAM cell or the number of the devices for performing the Write/Read operation. Especially for the case of very high resistance load devices, increased process complexity, extra masks, and high fabrication cost are required for forming the undoped polysilicon layers or the Thin Film Transistor (TFT) on the oxide and thus saving the chip area; however, the corresponding product yield is not high. Therefore, more efforts are needed to further reduce the areas occupied by the chip while improving the production yield.

Figure 1:
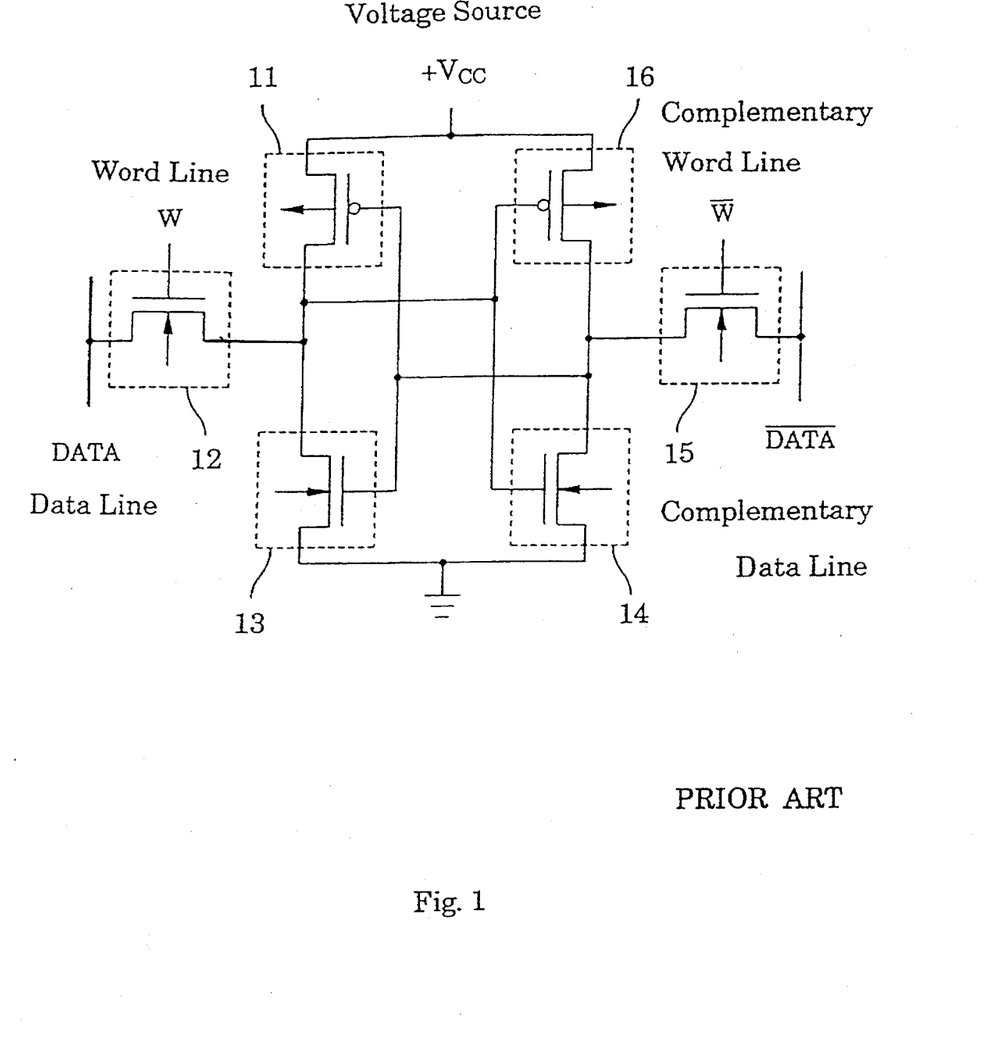
FIG. 1 is a circuit schematic of a conventional CMOS SRAM cell.
Figure 2:
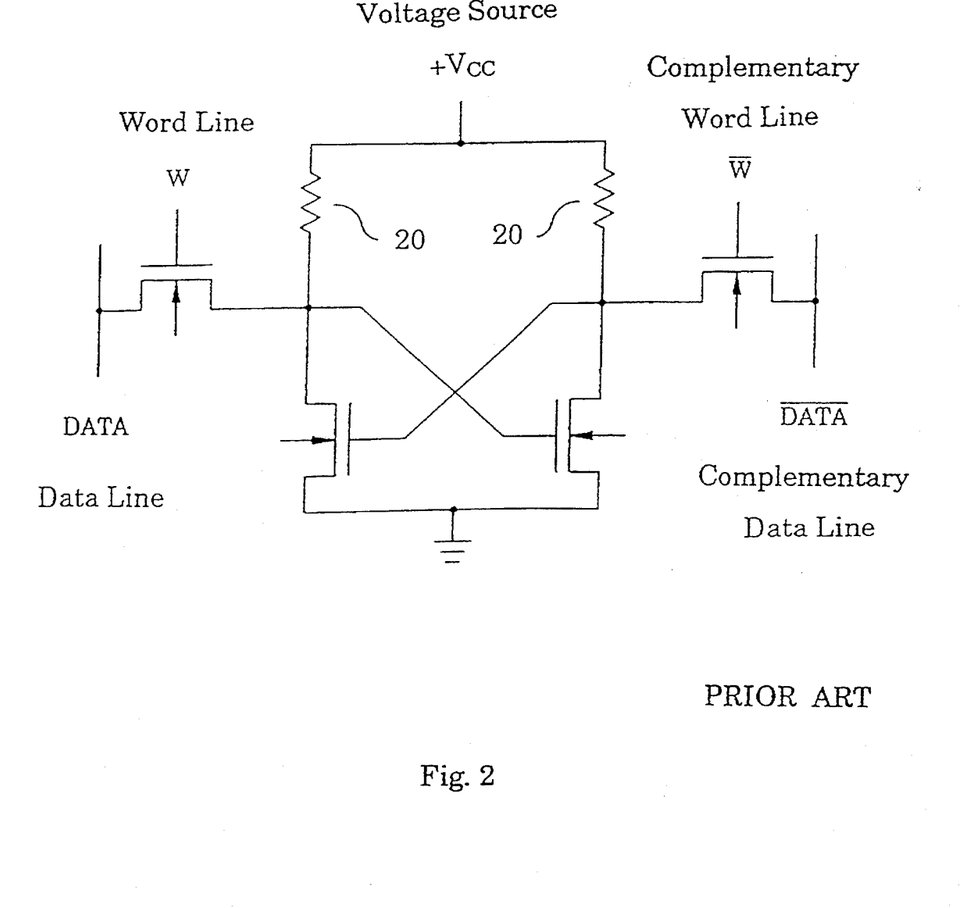
FIG. 2 is a circuit schematic of another conventional CMOS SRAM cell.

The structures of the conventional SRAM are shown in FIGS. 1 and 2. FIG. 1 shows a circuit schematic of a conventional SRAM cell configuration. The cell comprises a pair of cross-coupled inverters, p-MOSFET 11 and n-MOSFET 13, and p-MOSFET 16 and n-MOSFET 14, as the storage flip-flop or latch. In each inverter the gates of p-MOSFET and n-MOSFET are tied together and connected to the output of another inverter. The output of each inverter are the drains of p-MOSFET and n-MOSFET which are tied together. The conventional cell employs a pair of pass transistors, n-MOSFETs 12 and 15, as the access devices for data transfer into and out of the cell. Two column lines DATA and $\overline{\text{DATA}}$ and two row select lines W and $\overline{\text{W}}$ are depicted. This conventional cell requires 6 MOSFETs.

FIG. 2 shows a circuit schematic of a conventional CMOS cell using undoped polysilicon layer or thin-film transistor for providing very high resistance loads 20. FIG. 2 is very similar to FIG. 1 except for the type of the load. This cell requires complex processes and the resulting yield is low. This conventional cell requires four MOSFETs formed on the silicon plus two undoped polysilicon layers or TFTs formed on the oxide.

A Bipolar-CMOS (BICMOS) process has recently been introduced to achieve the above-mentioned object (refer to the paper: K. Sakui, et al. "A new static memory cell based on reverse base current (RBC) effect of bipolar transistor," *IEEE IEDM Tech. Dig.*, pp. 44–47, December 1988). In this BICMOS process, only two devices are needed for a SRAM cell: one vertical bipolar transistor and one MOSFET as a pass device. However, extra processing steps and increased masks are required along with special deep isolation techniques, resulting in high fabrication cost and process complexity. Also, the yield of the SRAM products utilizing such complex BICMOS process is usually low compared with the existing standard CMOS process. Therefore, the SRAM products fabricated in a complex BICMOS process cannot provide sufficient competition to the conventional CMOS SRAM products.

Very recently, a new phenomenon of base current reversal has been observed in a CMOS compatible high gain gated lateral bipolar transistor (refer to the paper: Tzuen-Hsi Huang and Ming-Jer Chen, "Base current reversal phenomenon in a CMOS compatible high gain n-p-n gated lateral bipolar transistor," *IEEE Trans. Electron Devices,* Vol. 42, No. 2, pp.321–327, February 1995). This new phenomenon has been extensively investigated and has been found to have many applications. This invention employs this new phenomenon in the existing standard CMOS process for realizing a new SRAM cell constructed by only two MOSFETs. This new SRAM also features only one-sided peripheral circuitry for Read/Write action. Therefore, this invention can efficiently save the chip area with high yield since it is fully compatible with the existing low-cost standard CMOS process.

SUMMARY OF THE PRESENT INVENTION

It is therefore an object of this invention to provide a new device configuration to overcome the difficulties and limitations encountered in the conventional SRAM cells to reduce the process complexity in fabrication and the areas occupied by the IC chips, and to increase the production yield thus reducing the fabrication costs.

Briefly, in a preferred embodiment, the present invention includes a new SRAM cell which comprises a total of only two MOSFETs, an n-MOSFET and a p-MOSFET. In this new cell the n-MOSFET is operated as a three-terminal high-gain gated lateral bipolar transistor by transferring the role of source as emitter, drain as collector, and p-well as base, all with the p-well connected to the gate. The new SRAM cell of this invention employs the base current reversal phenomenon of the transistor. This effect can effectively provide two stable states for high- and low-level logic. Only simple one-sided peripheral circuitry for Read/Write function is needed simultaneously for this new cell. Therefore, the new cell of this invention can provide new features: small chip area consumption, full compatibility with existing stable low-cost CMOS process and thus high yield.

It is an advantage of the present invention that it requires only simple one-sided peripheral circuitry for Read/Write function.

It is another advantage of the present invention that its new cell only requires reduced chip area consumption and is fully compatible with existing stable low-cost CMOS process and have high yield.

These and other objects and the advantages of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 3:
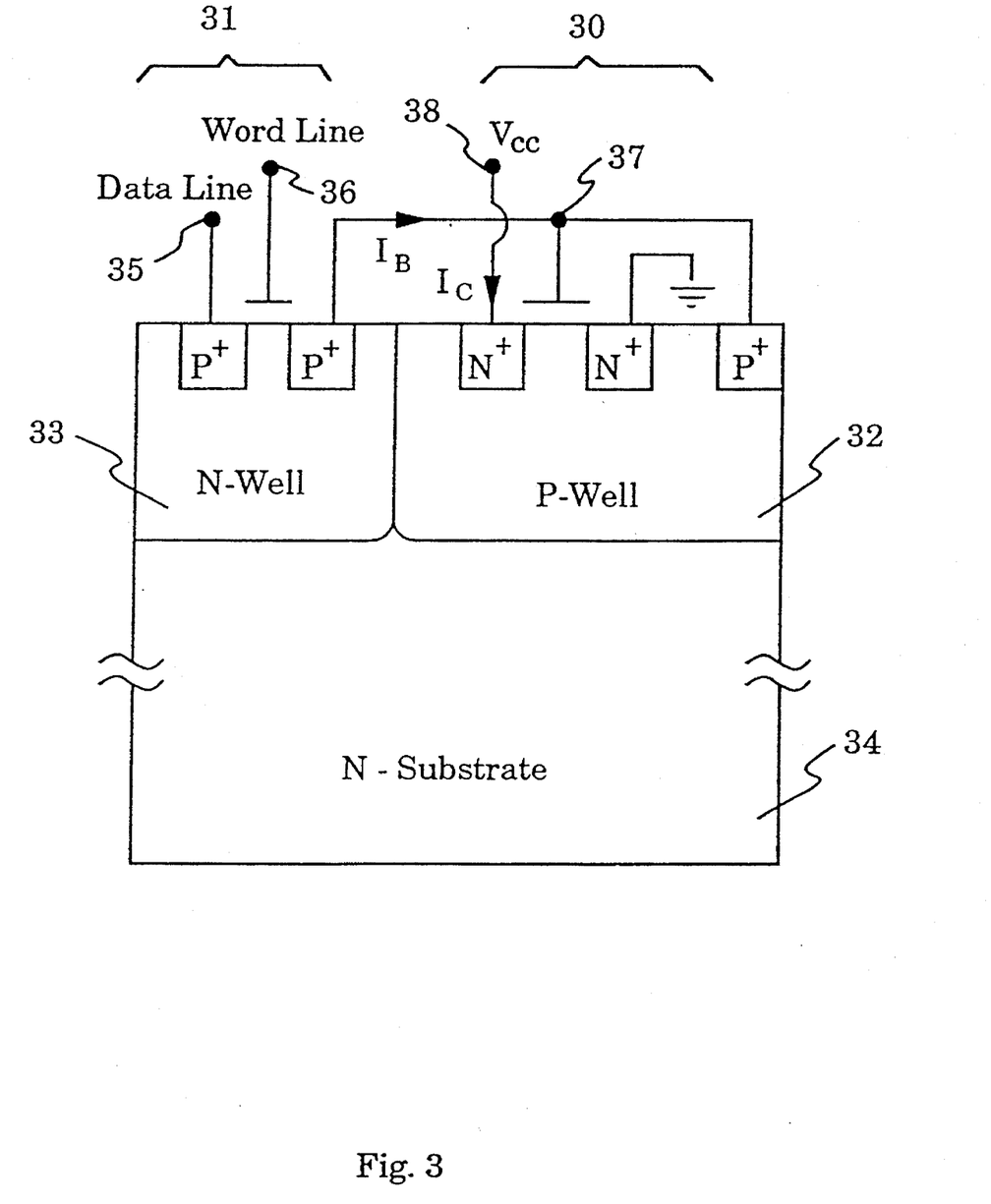
FIG. 3 is a cross section of the new SRAM cell of this invention.
Figure 4:
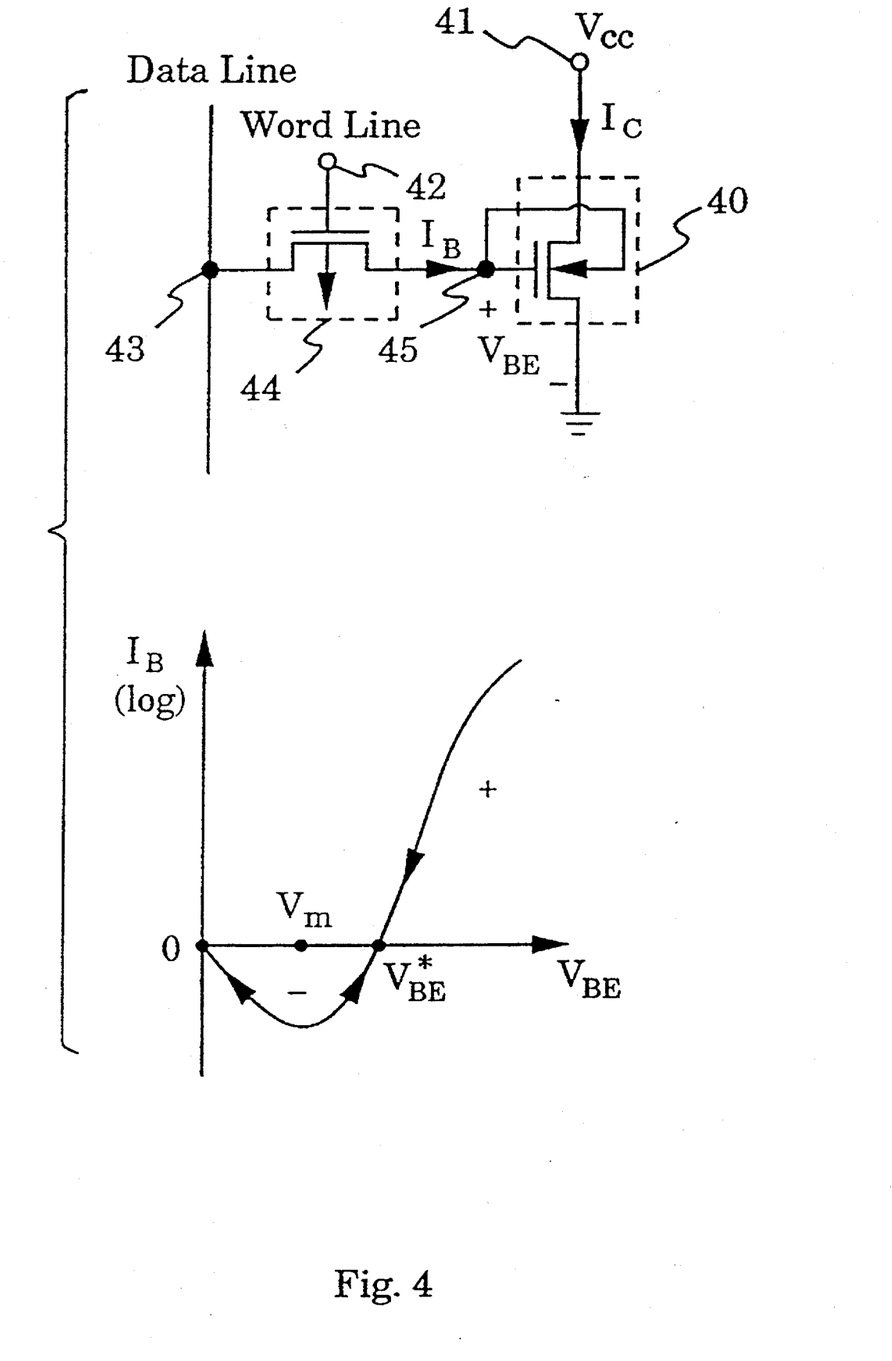
FIG. 4 is a circuit schematic of the new SRAM cell of this invention.
Figure 5:
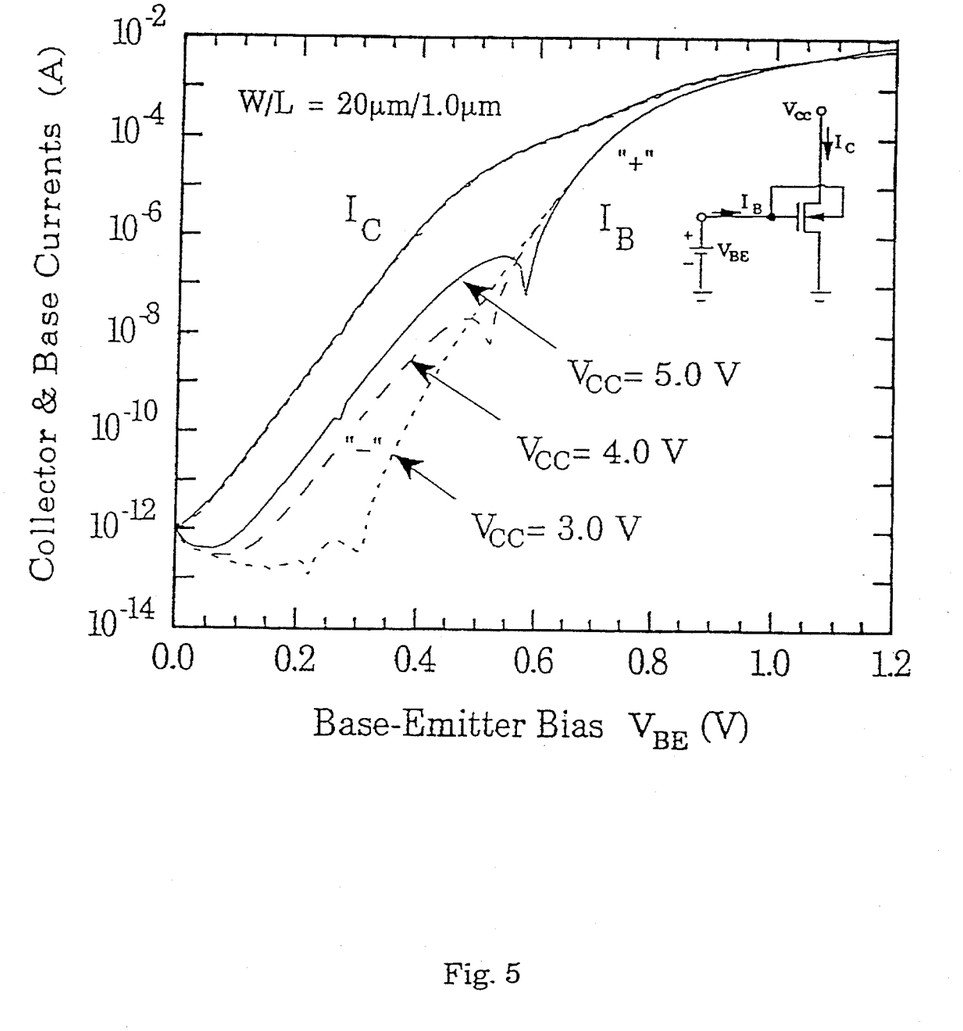
FIG. 5 is an experimental plot of the collector current and base current versus base-to-emitter voltage characteristics as functions of power supply voltage $V_{cc}$ for the high-gain gated lateral bipolar transistor operated in the base current reversal mode, as is employed in the new cell of this invention. W/L is the gate width to length ratio.

The circuit and characteristics of a preferred embodiment with the base current reversal property of a high gain gated lateral BJT are shown in FIGS. 3, 4, and 5. The cross section view of the new SRAM cell of this invention is shown in FIG. 3 and the equivalent circuit of the cell is drawn in FIG. 4. This memory cell consists of only one PMOS transistor and one n-p-n gated lateral bipolar transistor. The p-MOS transistor is used as a pass transistor and the gated lateral bipolar transistor is operated in the base current reversal regime. The mechanism of reverse base current phenomenon is due to the avalanche generation current caused by impact ionization. That is, the total base terminal current $I_B$ can be expressed as $$I_B = I_{B,F} - I_{B,R} \quad (1)$$

where $I_{B,F}$ is the normal forward base current due to the carrier injection at the forward emitter junction; $I_{B,R}$ is the generation current via impact ionization at the collector sidewall junction. The generation current $I_{B,R}$ can be evaluated by $$I_{BR} = K \cdot I_C^*(V_{CB})V_{(CB} + \phi_{bi}\Phi_{so})\exp\left(\frac{-b_n}{A(V_{CB} + \phi_{bi}\Phi_{so})}\right) \quad (2)$$

where $I^*_c(V_{CB})$ is the initial injection collector current without the generation current component; and K, A, $f_{bi}$, $j_{so}$, and $b_n$ are the device parameters. As long as $I_{B,R}>I_{B,F}$, the direction of the total base terminal current will be reversed. From the measured Gummel I-V characteristics of an n-p-n gated lateral BJT (W/L=20 μm/1.0 μm) as shown in FIG. 5, we can observe that when $V_{cc}$=3.0 V, the base current reversal disappears. When $V_{cc}$ is greater than 4.0 V, the base current reversal is obviously observed. There is a dip occurring at $V^*_{BE}$0.5 V when $V_{cc}$=4.0 V and $V^*_{BE=}$0.6 V when $V_{cc}$=5.0 V.

As shown in the equivalent circuit in FIG. 4, the pass transistor is controlled by the word line. When the R/W signal on the word line enables the pass transistor, the "data" on the data line is transferred to the base terminal of the gated lateral bipolar transistor. If the "data" is signed "High" (say, 0.6 V), the base terminal voltage will be locked at the $V^*_{BE}$ where the dip occurs. The "High" logic level is about 0.4–0.8 V depending on the value of $V_{cc}$. On the other hand, if the "data" is signed "Low" (say, 0 V) the base terminal voltage will be driven by the leakage current to $V_{EB}$=0 V. For the case of the pass transistor being turn off, i.e.,,, $I_B$=0, if the initial values of $V_{BE}$ are between 0 and $V_m$, $V_{BE}$ will return to a stable value of 0 V; while if the initial values of $V_{BE}$ are larger than $V_m$, then $V_{BE}$ will finally return to a stable value of $V^*_{BE}$. Therefore, there are two stable states at the base terminal depending on the data selected. Due to this property, the circuit configuration can be used as a storage element instead of the conventional six-transistor latch circuit.

There is another embodiment of this invention shown in FIGS. 3, 4, 5, 6, 7, and 9. The new SRAM cell of this invention comprises a high gain gated n-p-n lateral bipolar transistor 30(40), and a p-MOSFET 31(44). The n-well 33 and p-well 32 are formed on the n-type substrate 34 using a typical twin-well CMOS process. In this embodiment, the high gain gated n-p-n lateral bipolar transistor 30(40) is indeed the n-MOSFET with the p-well (base)-to-source (emitter) junction forward biased; and the gate and p-well (base) of the transistor 30 (40) are tied together. FIG. 3 is the cross section of the invention corresponding to FIG. 4. Transistor 30(40) is operated as a high gain gated lateral n-p-n bipolar transistor: gate 37(45) is connected to the p-well (base); the source (emitter) is grounded; and drain (collector) 38(41) is connected to the power supply. The p-MOSFET 31(44) acts as a pass transistor for data transfer: gate 36(42) is connected to the Word line; source 35(43) is connected to the Data line; and drain 37(45) is connected to the base (gate) of the transistor 30(40).

Figure 6:
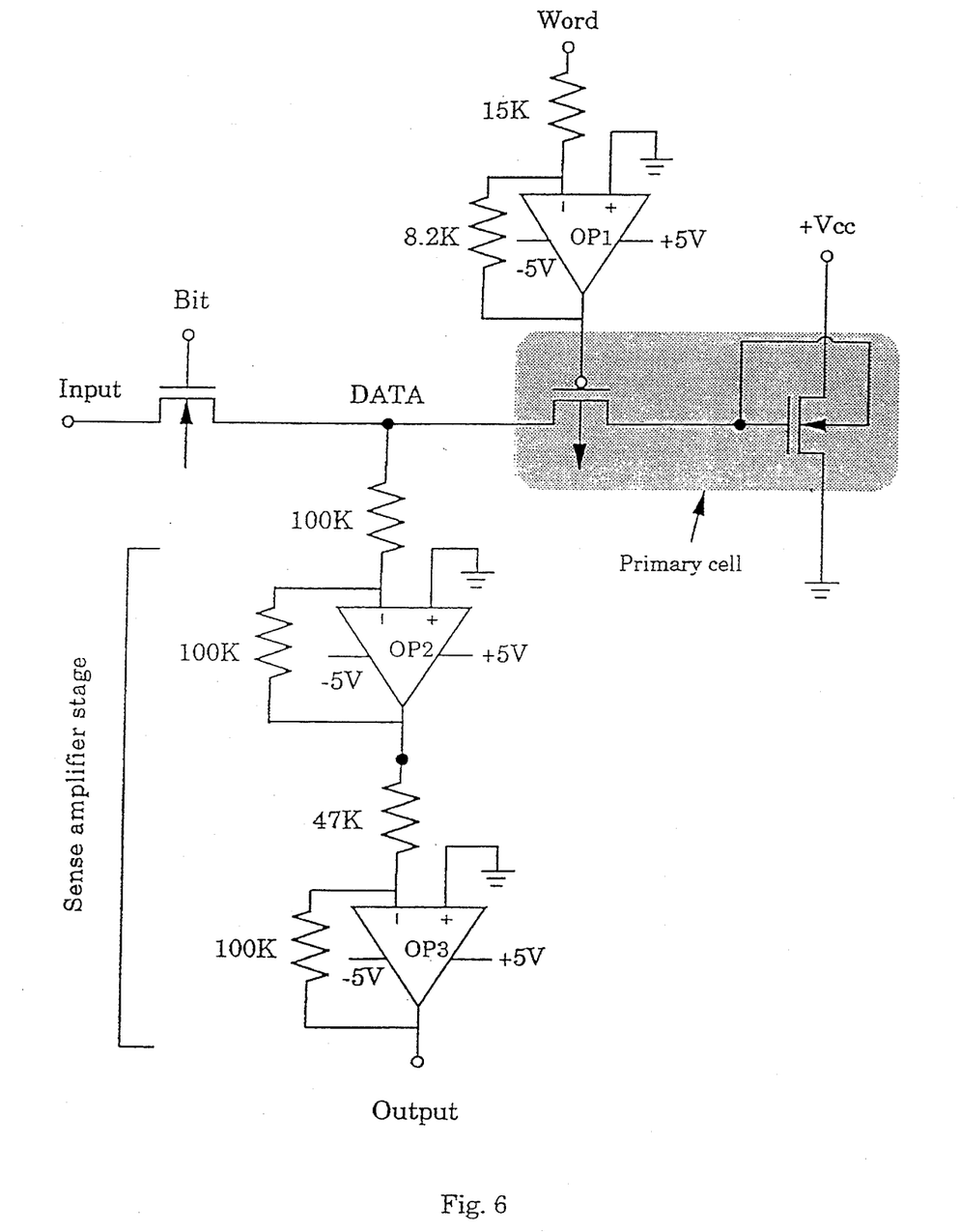
FIG. 6 is a complete test diagram for the new cell of this invention.

The prototype circuit for testing the new cell of this invention is shown in FIG. 6. The cell is constructed by the discrete-type PMOS (W/L=20 μm/0.9 μm) and NMOS (W/L=20 μm/1.0 μm) transistors fabricated by a 0.8 μm standard CMOS technology. The peripheral circuits are implemented by the conventional OP amplifier (μA741). High input impedance of the OP amplifier is helpful to reduce the load effect of the data line, but probably slows down the operation speed. Due to the virtual ground, the input impedance of the OP amplifiers in series (OP2 and OP3) can be about 100 KΩ. Such high impedance would not lead to data loss after transferring "data" into the data line. The pass transistor gate is also connected by an inverter which translates the input signal (0–+5 V) into an inverted signal (0—1.5 V). Such inverted signal is utilized for consideration of the correct function of data transfer when using our PMOS pass transistor. The test circuit configuration proposed here is not optimized but for the off-chip test of the memory cell performance.

Figure 7:
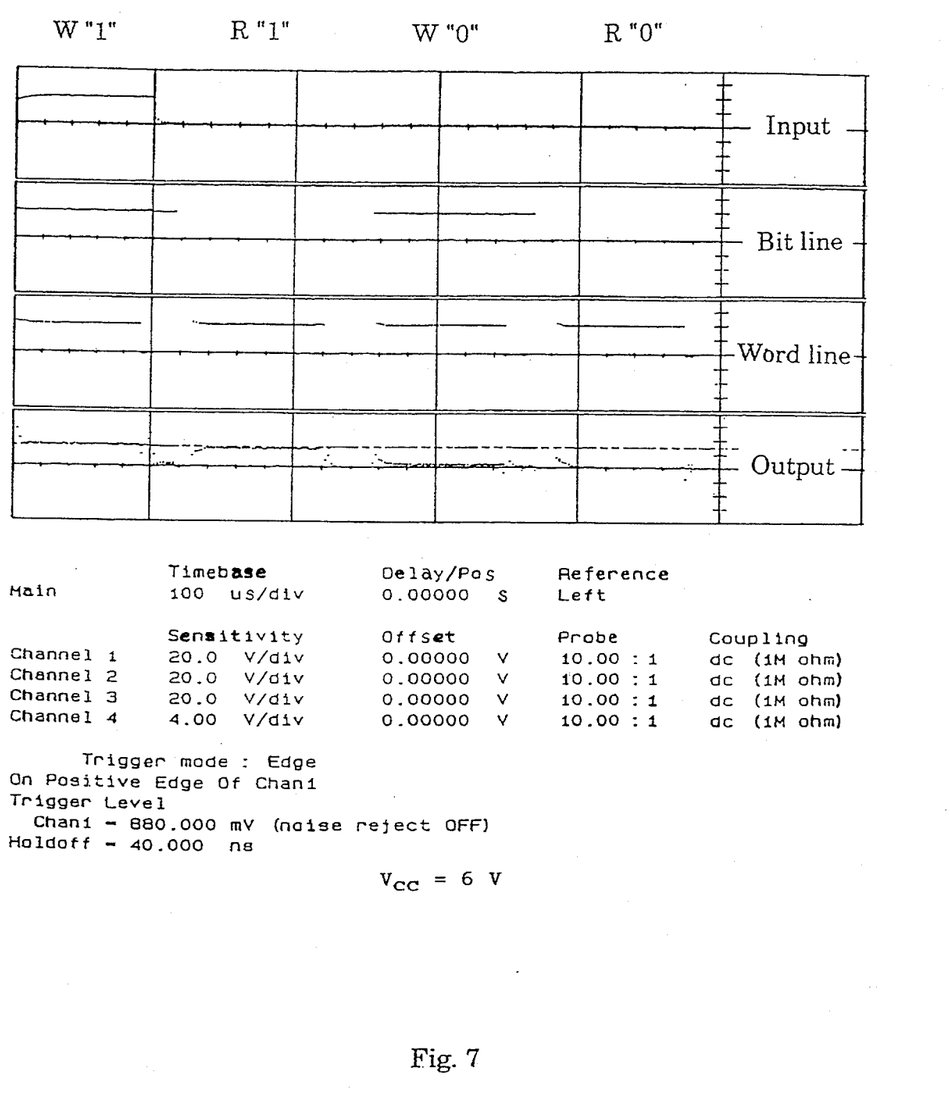
FIG. 7 is an experimental Read/Write waveform plot of the new cell of this invention measured at power supply voltage $V_{cc}$=6 V.
Figure 8:
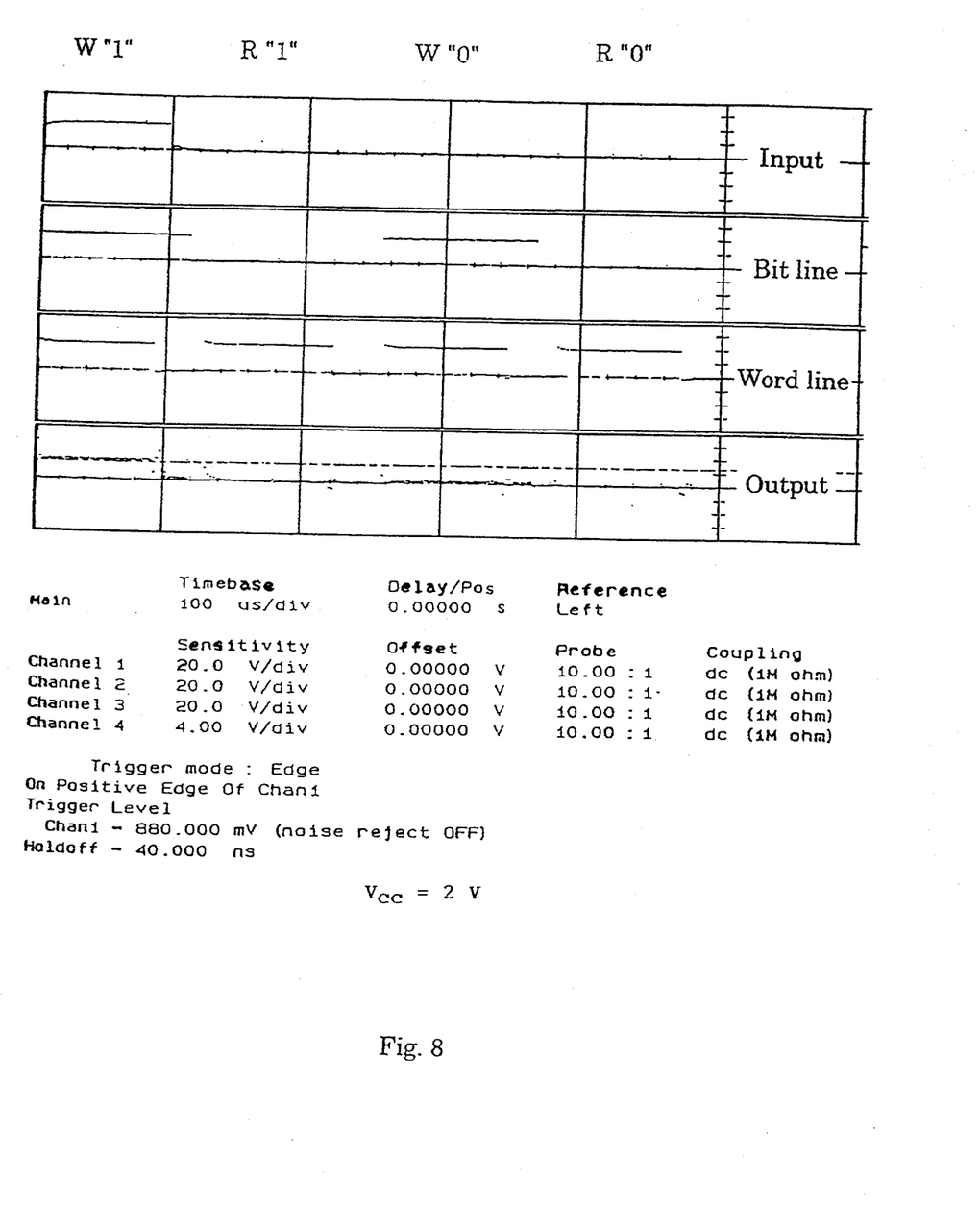
FIG. 8 is an experimental Read/Write waveform plot of the new cell of this invention measured at power supply voltage $V_{cc}$=2 V.

FIG. 7 and FIG. 8 are the measured waveforms of the new memory cell for $V_{cc}$ values of 6.0 V and 2.0 V, respectively. The signal shown in Channel 1 is the input "data" signal, the signal in Channel 2 is the "bit-line" signal, and the signal in Channel 3 is the "word-line" signal. Note that the voltage level of these signals is based on the standard 5 V logic level. As shown in these figures, the voltage reads 10 V, which is twice the real value applied. This is due to the impedance mismatch between the probe of the scope and that of the pulse generators. When $V_{cc}$=6.0 V, the reverse base current effect occurs and thus the R/W function of the cell can work successfully, as shown in FIG. 7. On the other hand, for the case of $V_{cc}$=2.0 V where the base current reversal effect disappears, the R/W function fails as shown in FIG. 8. Note that the value of $V_{cc}$ needs to be increased from $V_{cc}$=2.0 V for ensuring the reverse base current and thus the correct function of the cell. Also note that the impact ionization current must be large enough to retain the junction injection of the forward emitter. This way, the base terminal can be kept at the "High" logic state. That is, the minimum value of $V_{cc}$ not only guarantees the impact ionization but also enables the dip to occur at the $V^*_{BE}$ value which is normally greater than the junction cut-in voltage. A gated lateral bipolar transistor with short channel length (base width) can offer a small value of $V_{cc}$ needed for the reverse base current effect. That is, the critical $V_{cc}$ value of such memory cell can be made less than 5.0 V, which will be much more useful in the present logic environment.

Figure 9:
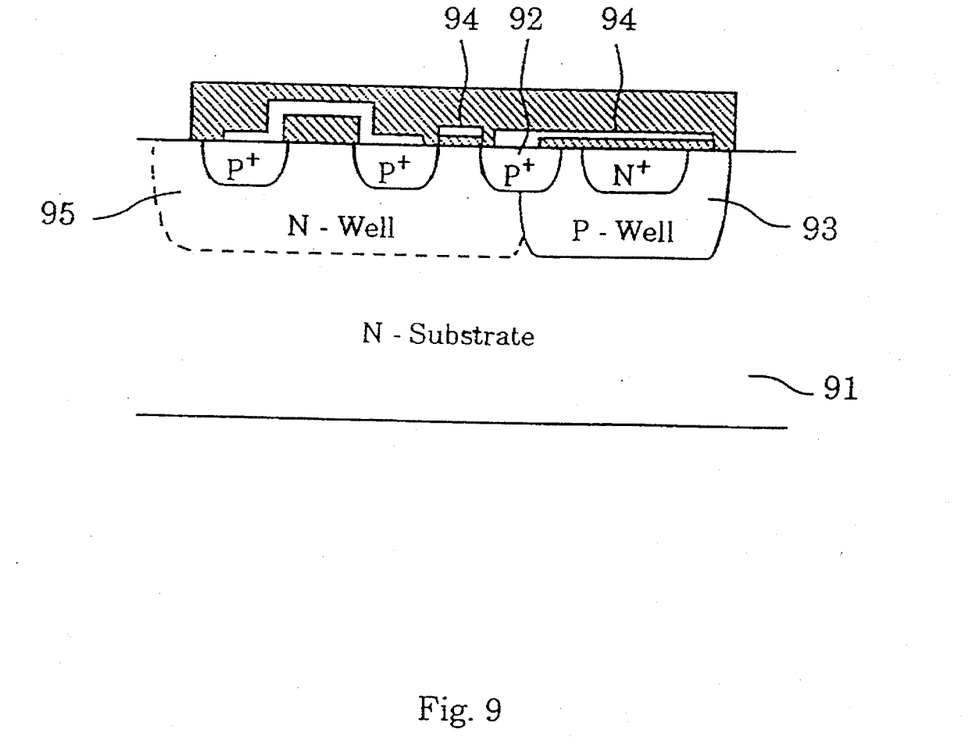
FIG. 9 is a cross section of the merged structure of the new cell of this invention.
Figure 10:
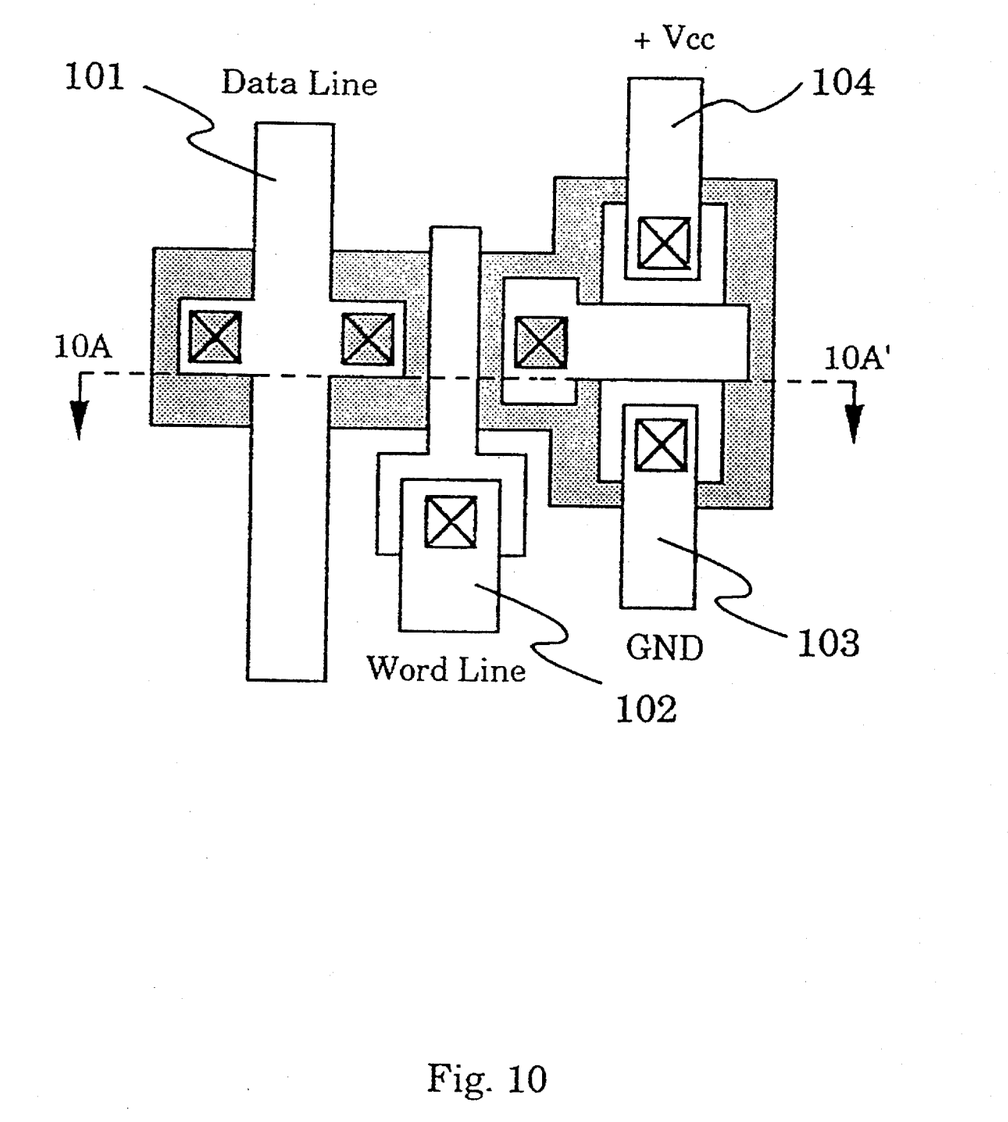
FIG. 10 is a top-side layout of the merged structure of the new cell of this invention.

Refer now to FIG. 9 and FIG. 10, there is shown another embodiment of this invention. The cell cross section in FIG. 9 is drawn along the 10A—10A' line in its top-side layout in FIG. 10. This is one of the merged structures for efficiently reducing the chip area when realizing the new cell of this invention. In FIG. 9, both n-well 95 and p-well 93 are formed on the n-type substrate 91; the n-MOSFET as gated lateral BJT is formed on the p-well 93; the drain 92 of the p-MOSFET is directly formed in the region between the p-well 93 and the n-well 95, which can also be used as the ohmic connection region for the p-well 93; and the gates of both MOSFETs are the doped polysilicon layers. In FIG. 10, data line 101 is connected to the source of the p-MOSFET; write line 102 is connected to the gate of the p-MOSFET; ground line 103 is connected to the source (emitter) of the n-MOSFET or gated lateral n-p-n BJT; and power supply line 104 is connected to the drain (collector) of the n-MOSFET or gated lateral n-p-n BJT.

The above disclosure is not intended as limiting. Those skilled in the art will readily observe that numerous modifications and alterations of the device may be made while retaining the teachings of the invention. Accordingly, the above disclosure should be construed as limited only by the metes and bounds of the appended claims.

We claim:

1. An SRAM cell, comprising:
    a high gain gated n-p-n lateral BJT in an n-MOSFET structure operated in base current reverse mode for providing two stable logic levels; and
    a data passing means including a p-MOSFET for transferring data in and out of said SRAM cell.

2. The SRAM cell of claim 1 wherein said gated lateral BJT further comprising:
    a gate, an emitter, a base, and a collector wherein said gate and said base are tied together; and
    said emitter is grounded, and said collector is connected to a power supply.

3. The SRAM cell of claim I wherein said p-MOSFET further comprising:
    a gate, a source, and a drain wherein said gate is connected to a word line; said source is connected to a data line; and
    said drain is connected to the base of said gated lateral BJT.

4. An SRAM cell comprising:
    a high gain gated p-n-p lateral BJT in an p-MOSFET structure operated in base current reverse mode for providing two stable logic levels; and
    a data passing means including a n-MOSFET for transferring data in and out of said SRAM cell.

5. The SRAM cell of claim 4 wherein said gated lateral BJT further comprising:
    a gate, an emitter, a base, and a collector wherein said gate and said base are tied together; and
    said emitter is grounded, and said collector is connected to a power supply.

6. The SRAM cell of claim 4 wherein said n-MOSFET further comprising:
    a gate, a source, and a drain wherein said gate is connected to a word line; said source is connected to a data line; and
    said drain is connected to the base of said gated lateral BJT.

7. The SRAM cell of claim 4 further comprising:
    a p-type substrate for forming and supporting said SRAM thereon.

8. The SRAM cell of claim 6 wherein:
    said drain of said n-MOSFET being disposed between a p-well and a n-well of said n-MOSFET for constructing a merged structure for reducing occupied areas by said n-MOSFET employed as a passing transistor therein.

9. The SRAM cell of claim I wherein:
    said drain of said p-MOSFET being disposed between a p-well and a n-well of said p-MOSFET for constructing a merged structure for reducing occupied areas by said p-MOSFET employed as a passing transistor therein.

10. The SRAM cell of claim 8 wherein:
    said passing transistor being connected to the base of said gated lateral BJT for providing an ohmic connection thereto.

11. The SRAM cell of claim 9 wherein:
    said passing transistor being connected to the base of said gated lateral BJT for providing an ohmic connection thereto.

12. The SRAM cell of claim 1 wherein:
    said cell being fabricated by a single-well CMOS process.

13. The SRAM cell of claim 1 wherein:
    said cell being fabricated by a twin-well CMOS process.

14. An SRAM cell comprising:
    a high gain gated n-p-n lateral BJT in an n-MOSFET structure operated in base current reverse mode for providing two stable logic levels; and
    a data passing means including a p-MOSFET for transferring data in and out of said SRAM cell;
    said gated lateral BJT further including a gate, an emitter, a base, and a collector wherein said gate and said base are tied together; and said emitter is grounded, and said collector is connected to a power supply; and
    said p-MOSFET further including a gate, a source, and a drain wherein said gate is connected to a word line; said source is connected to a data line; and said drain is connected to the base of said gated lateral BJT;
    said drain of said p-MOSFET being disposed between a p-well and a n-well of said p-MOSFET for constructing a merged structure for reducing occupied areas by said p-MOSFET employed as a passing transistor therein; and
    said passing transistor being connected to the base of said gated lateral BJT for providing an ohmic connection thereto.

15. An SRAM cell comprising:
    a high gain gated p-n-p lateral BJT in an p-MOSFET structure operated in base current reverse mode for providing two stable logic level; and a data passing means including a n-MOSFET for transferring data in and out of said SRAM cell;

said gated lateral BJT further including a gate, an emitter, a base, and a collector wherein said gate and said base are tied together; and said emitter is grounded, and said collector is connected to a power supply; and said n-MOSFET further including a gate, a source, and a dram whereto said gate is connected to a word line; said source is connected to a data line: and said drain is connected to the base of said gated lateral BJT;

said drain of said n-MOSFET being disposed between a p-well and a n-well of said n-MOSFET for constructing a merged structure for reducing occupied areas by said n-MOSFET employed as a passing transistor thereto; and said passing transistor being connected to the base of said gated lateral BJT for providing an ohmic connection thereto.

* * * * *